United States Patent
Chen et al.

(10) Patent No.: US 7,230,270 B2
(45) Date of Patent: Jun. 12, 2007

(54) SELF-ALIGNED DOUBLE GATE DEVICE AND METHOD FOR FORMING SAME

(75) Inventors: Hao-Yu Chen, Kaohsiung (TW); Ju-Wang Hsu, Taipei (TW); Baw-Ching Perng, Hsin-Chu (TW); Fu-Liang Yang, Hsin-Chu (TW)

(73) Assignee: Taiwan Semiconductor Manfacturing Company, Ltd., Hsin-Chu (TW)

( * ) Notice: Subject to any disclaimer, the term of this patent is extended or adjusted under 35 U.S.C. 154(b) by 52 days.

(21) Appl. No.: 10/997,446

(22) Filed: Nov. 24, 2004

(65) Prior Publication Data

US 2006/0108644 A1    May 25, 2006

(51) Int. Cl.
*H01L 29/10* (2006.01)
*H01L 27/01* (2006.01)

(52) U.S. Cl. .......................... 257/67; 257/69; 257/347; 257/350

(58) Field of Classification Search ............. 257/67–70, 257/664, 531, 338, 347, 350, 351; 438/152
See application file for complete search history.

(56) References Cited

U.S. PATENT DOCUMENTS

| | | | |
|---|---|---|---|
| 5,185,535 A | 2/1993 | Farb et al. | |
| 6,521,947 B1 | 2/2003 | Ajmera et al. | |
| 6,563,173 B2 * | 5/2003 | Bolam et al. | 257/349 |
| 6,670,716 B2 * | 12/2003 | Christensen et al. | 257/762 |
| 6,720,242 B2 | 4/2004 | Burbach et al. | |
| 6,876,037 B2 * | 4/2005 | Wei et al. | 257/347 |

OTHER PUBLICATIONS

Guarini, K.W., et al., "Triple-Self-Aligned, Planar Double-Gate MOSFETs: Devices and Circuits," IEDM 2001, Mar. 2001, pp. 425-428, IEEE, Los Alamitos, CA.

Ieong, M., et al., "Experimental Evaluation of Carrier Transport and Device Design for Planar Symmetric/Asymmetric Double-Gate/Ground-plane CMOSFETs," IEDM 2001, Mar. 2001, pp. 441-444, IEEE, Los Alamitos, CA.

Jones, E.C., et al., "Bonding of Thin Films on 200 mm Silicon Wafers Using Chemical Mechanical Polishing," Proceedings of the 1998 IEEE International SOI Conference, Oct. 1998, pp. 161-162, IEEE, Los Alamitos, CA.

Moers, J., et al., "Vertical p-channel Double-Gate MOSFETs," 2003, 4 pp., http://www.chipidea.com/esscirc2003/papers/essderc/oral_presentations/030_37.pdf.

Wong, H.-S.P., et al., "Device Design Considerations for Double-Gate, Ground-Plane, and Single-Gated Ultra-Thin SOI MOSFET's at the 25 nm Channel Length Generation," IEDM 1998, Sep. 1998, pp. 407-410, IEEE, Los Alamitos, CA.

Wong, H.-S.P., et al., "Self-Aligned (Top and Bottom) Double-Gate MOSFET with a 25 nm Thick Silicon Channel," IEDM 1997, Jul. 1997, pp. 427-430, IEEE, Los Alamitos, CA.

* cited by examiner

*Primary Examiner*—Hung Vu
(74) *Attorney, Agent, or Firm*—Slater & Matsil, L.L.P.

(57) ABSTRACT

In a method of forming a double gate device, a buried insulating layer having a thickness of less than about 30 nm is formed on a first substrate. A second substrate is formed on the buried insulating layer. A pad layer is formed over the second substrate. A mask layer is formed over the pad layer. A first trench is formed extending through the pad layer, second substrate, buried insulating layer and into the first substrate. The first trench is filled with a first isolation. A second trench is formed in the first isolation and filled with a conductive material. An MOS transistor is formed on the second substrate. A bottom gate is formed under the buried insulating layer and self-aligned to the top gate formed on the second substrate.

28 Claims, 9 Drawing Sheets

SELF-ALIGNED DOUBLE GATE DEVICE AND METHOD FOR FORMING SAME

TECHNICAL FIELD

This invention relates generally to semiconductor devices, and more specifically to the double gate MOS devices.

BACKGROUND

Double gate MOS devices have drawn increasing interest within the recent years because of their capability to reduce short channel effects. The downscaling of MOS devices will continue for the next decade. By this downscaling, the physical limitations of device behavior, as predicted for planar devices, are reached and partially exceeded. Thus, the so-called short channel effects become an issue, which is answered by the changing of device layout. For sub 50 nm devices, the double gate device layout is one of the most promising concepts to deal with the issue of short channel effects. Therefore, double gate devices have drawn increasing attention recent years. In double gate devices, there are two gates biased in parallel to form an inversion channel on both sides of a silicon layer. If the silicon layer is thin enough, these two inversion channels will overlap. The field penetration from drain to source is decreased, which decreases short channel effects.

There are three different layouts of double-gate MOS devices. In the first layout, the channel and the current are in the plane of the wafer, so one gate is above and one gate is below the channel layer. The second layout is the so-called FinFET layout. The silicon channel layer is perpendicular to the wafer surface, but the current is still in the plane of the wafer. The third layout, like the FinFET, has a silicon ridge of a few tenths of nanometers in thickness, which is the active area of the transistor. In this layout, the current flow is perpendicular to the surface of the wafer.

FIG. 1 illustrates a conventional double gate device 1 having the first layout with one gate above another. It comprises source and drain 8, a top gate 2, a bottom gate 4 and a channel 6. The channel 6 resides between the top gate 2 and the bottom gate 4, and is typically separated by oxides 3. The double gate device 1 needs a complex process flow, including epitaxy, to produce the double gate structure. In one of the conventional methods, the buried oxide 3 is formed first. A cavity is then formed for the channel 6 and source and drain regions 8. The channel 6 and source and drain regions 8 are then epitaxially grown from a seed silicon. The conventional double gate devices and forming methods have some disadvantages. The forming methods are complex and costly. Channel thickness T is typically in the range of about 10 nm so that it is hard to use the conventional methods to achieve desired threshold voltage. The conventional double gate devices could become inactive when the bottom gate voltage is high, such as around 2.5V. This significantly limits the performance improvement.

Double gate devices can be used for different applications by adjusting bottom gate voltage. Typically, when high performance is desired, a higher bottom gate voltage can be applied so that the device has higher speed, although the sub-threshold leakage and power consumption are high. When low power is desired, for example, when a circuit is in standby mode, a lower bottom gate voltage can be applied. With a low bottom gate voltage, the leakage current and power consumption are significantly lower. However, the circuit speed is lower.

The double gate device will become a mainstream technology in the semiconductor technology because of its superior device behavior during scaling. The present invention proposes a new device structure and process forming the double gate device.

SUMMARY OF THE INVENTION

The preferred embodiment of the present invention presents a structure of double gate devices and a method of forming the double gate devices.

In accordance with one aspect of the present invention, a buried insulating layer having a thickness of less than about 30 nm is formed on a first substrate. A second substrate is formed on the buried insulating layer. A pad layer is formed over the second substrate. A mask layer is formed over the pad layer. A first trench is formed extending through the pad layer, second substrate, buried insulating layer and into the first substrate. The first trench is filled with a first isolation. A second trench is formed in the first isolation and filled with a conductive material. An MOS transistor is formed on the second substrate. A bottom gate is formed under the buried insulating layer and self-aligned to the top gate formed on the second substrate.

The preferred embodiment of the present invention has a very thin buried insulating layer and thin channel. The thin buried oxide and thin channel not only improve the device performance, but also simplify the manufacturing process since the lower step height does not need to be filled. The preferred embodiment of the present invention integrates the process of forming the STI and the substrate contact by forming the substrate contact through the STI. The bottom gate voltage that can be applied is increased. Therefore the device performance is further improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The cross sectional views of the intermediate stages of manufacturing preferred embodiments are illustrated in FIGS. 2 through 11, wherein like reference numbers are used to designate like elements throughout the various views and illustrative embodiments of the present invention.

Figure 1:
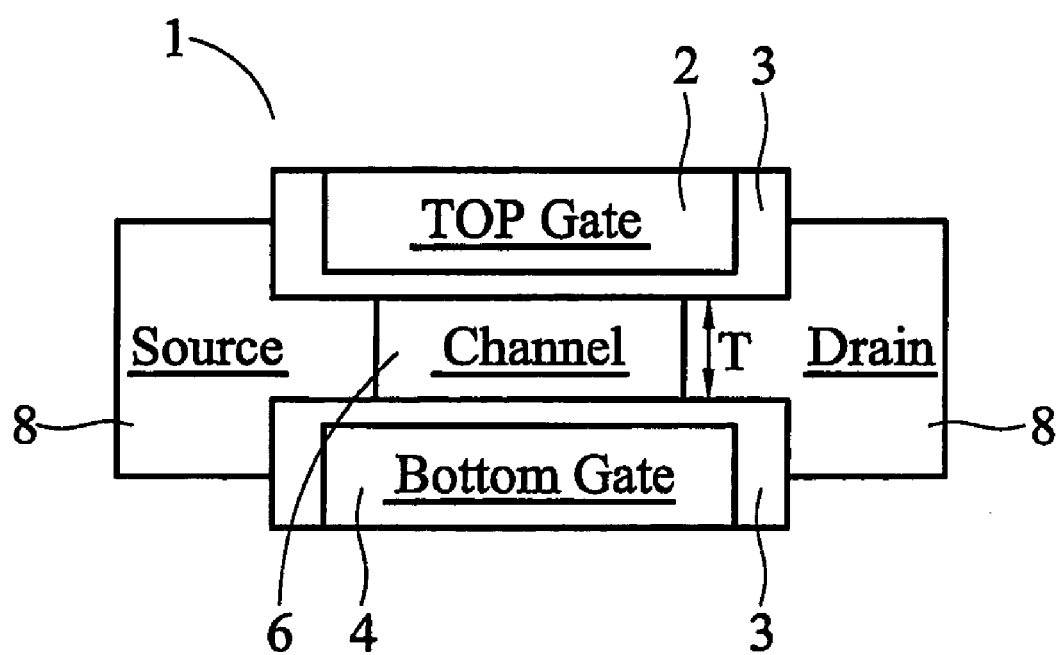
FIG. 1 illustrates a conventional double gate MOS device.
Figure 2:
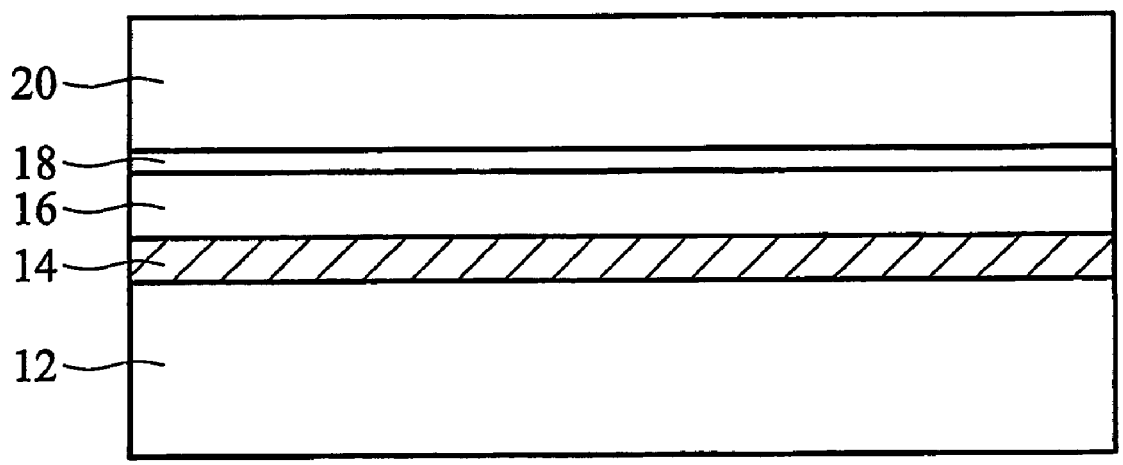
FIGS. 2 through 11 illustrate cross sectional views of intermediate stages of manufacturing preferred embodiments of the present invention.

FIG. 2 illustrates a structure having a thin buried insulating layer, or preferably buried oxide (BOX) 14 and a second substrate 16 formed on a first substrate 12. The first substrate 12 is preferably a pre-doped silicon substrate. It can also be Ge, SieGe, SiGeC or the like. For NMOS devices, the substrate 12 is doped p type, while for pMOS devices, the substrate 12 is doped n type, preferably by high energy implantation. Box 14 is preferably a thermal oxide with a thickness less than 30 nm, more preferably between about 10 nm and 30 nm, even more preferably about 20 nm. The second substrate 16 is preferably doped silicon, although other materials, such as Ge, SieGe, SiGeC and their combinations can also be used. The first substrate 12 and the second substrate 16 may comprise the same material or different materials. The thickness of the second substrate 16 is preferably less than about 20 nm, more preferably between about 10 nm and about 20 nm.

In the preferred embodiment, the BOX 14 and substrate 16 can be formed as such: a thin thermal oxide is formed on the first substrate 12. The thin thermal oxide will become the buried oxide 14 in the resulting structure, therefore, the thickness of the thin thermal oxide is less than about 30 nm. The substrate is then bonded with a second substrate 16 forming a silicon-on-insulator (SOI) structure. Since the second substrate is typically much thicker than the expected thickness of the substrate 16, a chemical mechanical polish (CMP) is performed to thin the second substrate 16 to a relatively small thickness, such as about 70 nm. Better precision control is needed to further thin the second substrate. The following method is preferably used. A second thermal oxide is grown on the surface of the second substrate 16. The thickness depends on the time and temperature. Preferably the second thermal oxide can be grown to about 20 nm, and then removed by etching. The steps of thermal oxidation and etching are repeated until the thickness of the second substrate 16 is as desired. Through this process, a chip is uniformly covered by BOX 14 and substrate 16. BOX 14 and substrate 16 may then be removed where double gate devices are not desired.

Figure 2A:
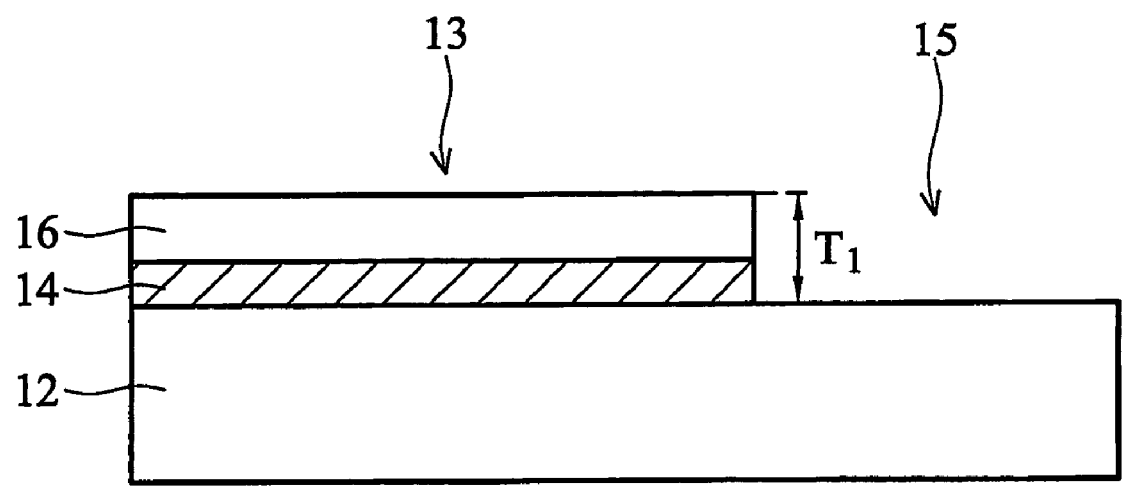

Compared to the conventional forming methods of double gate devices, the BOX 14 and substrate 16 are very thin. This provides several advantages. Firstly, the device performance is enhanced. Secondly, the formation of BOX 14 and substrate 16 increases less height of the device. With less height increment, no extra process is needed to level the height difference. On a chip, the active regions that have active devices formed may be divided into two groups, double gate regions and bulk regions, as illustrated in FIG. 2A. Double gate devices are formed in double gate regions 13. Non-double-gate devices such as analog and bipolar devices, I/O devices, and electrostatic discharge (ESD) devices are formed in bulk region 15. There is a step height $T_1$ between the double gate region 13 and bulk region 15. In the prior art, the buried oxide 14 typically has a thickness in a range of about 100 nm. With the thickness of the substrate 16 added, which is typically greater than 20 nm also, the step height is substantially higher than 120 nm. This large step height causes problems such as step coverage for subsequently formed layers. Therefore, the bulk regions need to be filled to the same level of double gate regions. Typically, a layer is epitaxially grown in a bulk region until the two regions 13 and 15 are leveled. In the preferred embodiment of the present invention, the combined thickness $T_1$ of BOX 14 and substrate 16 is substantially less than 50 nm. This height difference typically does not cause problems, such as step height coverage. Therefore, the surfaces do not need to be leveled and the step height is preserved. In one embodiment, it is preferred that in a chip, the ratio of the total area of the double gate regions 13 to the total area of bulk regions 15, which is also the remainder of the active regions, is substantially less than 0.5, although the ratio is a design consideration and will be determined by the number of double gate devices needed.

In the preferred embodiment, a chip is formed with double region 13 covers the entire chip. A separate process is performed to remove the BOX 14 and substrate 16 where bulk regions are desired. In other embodiments, BOX 14 and substrate 16 may only be formed where only double gate devices are desired.

FIG. 2 also illustrates a pad layer 18 and a mask layer 20 formed on substrate 16. Pad layer 18 is preferably formed through thermal process, preferably thermal oxidation to a thickness of between about 30 nm and about 100 nm. It is used to buffer substrate 16 and mask layer 20 so that less stress is generated. Pad layer 18 also acts as an etch stop layer for the subsequently formed mask layer 20. In the preferred embodiment, mask layer 20 is formed of silicon nitride using low-pressure chemical vapor deposition (LPCVD). Mask layer 20 is also referred as silicon nitride 20. In other embodiments, mask layer 20 is formed by thermal nitridation of silicon, plasma enhanced chemical vapor deposition (PECVD) or plasma anodic nitridation using nitrogen-hydrogen. It has a preferred thickness of between about 40 nm and about 80 nm.

Figure 3:
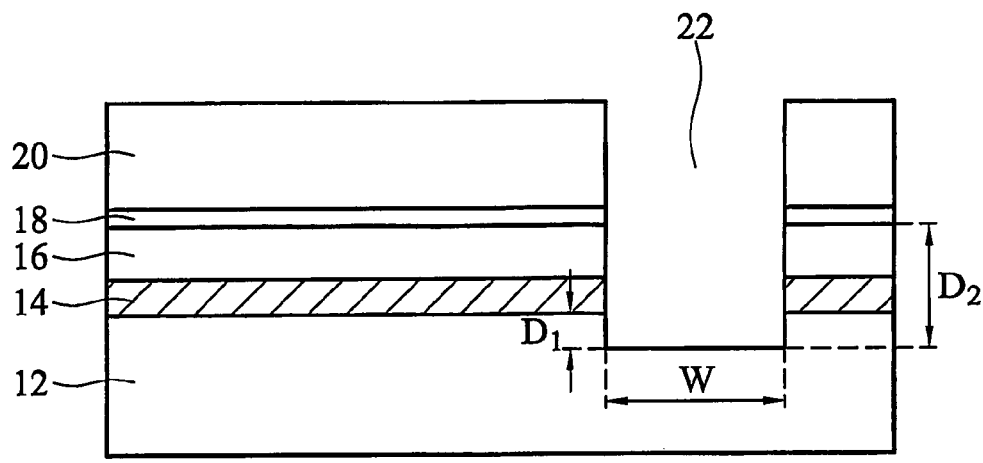

A trench 22 is anisotropically etched through mask layer, or silicon nitride 20, pad layer 18, substrate 16, buried oxide 14 and extending into substrate 14, as illustrated in FIG. 3. Trench 22 has a preferred width W of about 60 nm to about 220 nm. The extended portion of the trench 22 preferably has a depth $D_1$ of greater than about 10 nm. There is a step height $D_2$ between the top surface of the second substrate 16 and the bottom of the trench 22. It is preferred that the height difference $D_2$ is less than about 50 nm. The trench 22 separates devices and may be use to separate a P-well and an N-well, and an nMOS device and a pMOS device. One trench 22 may also separated from another trench by a well, preferably a P-well in between.

Figure 4:
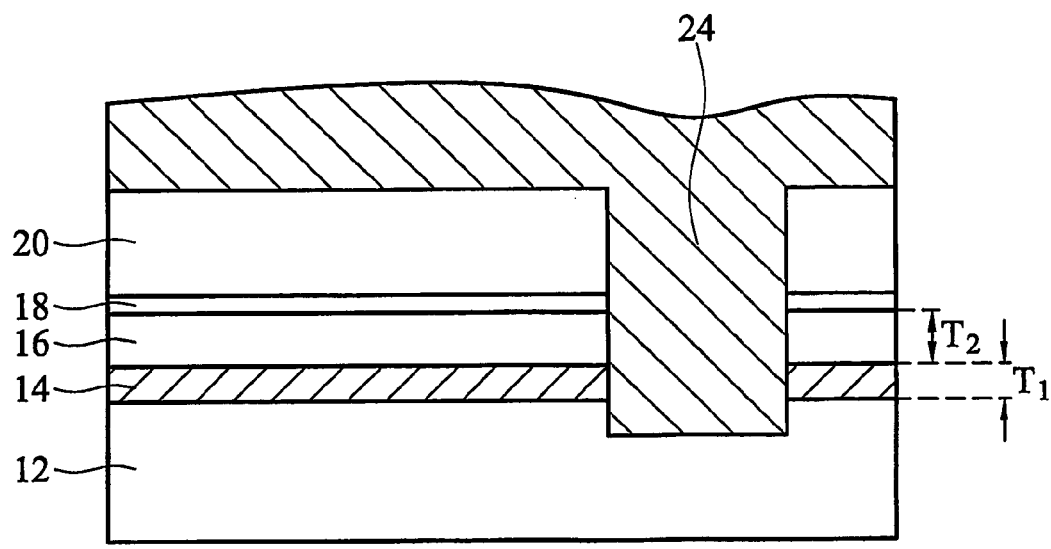
Figure 5:
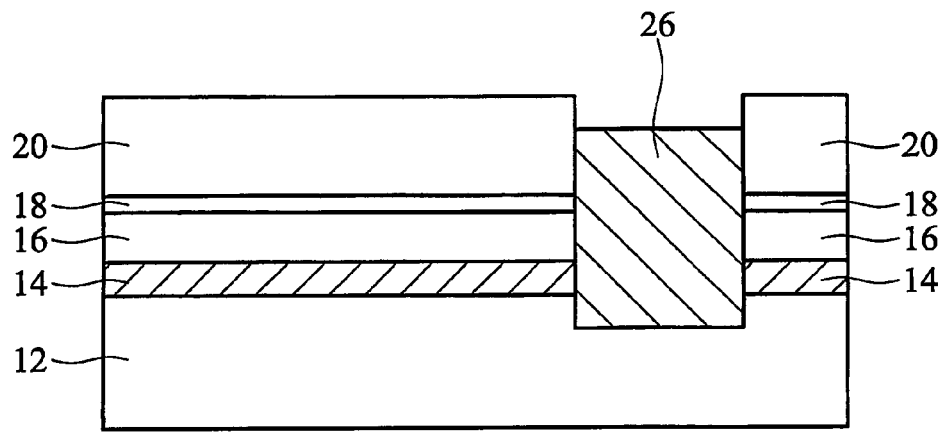
Figure 6:
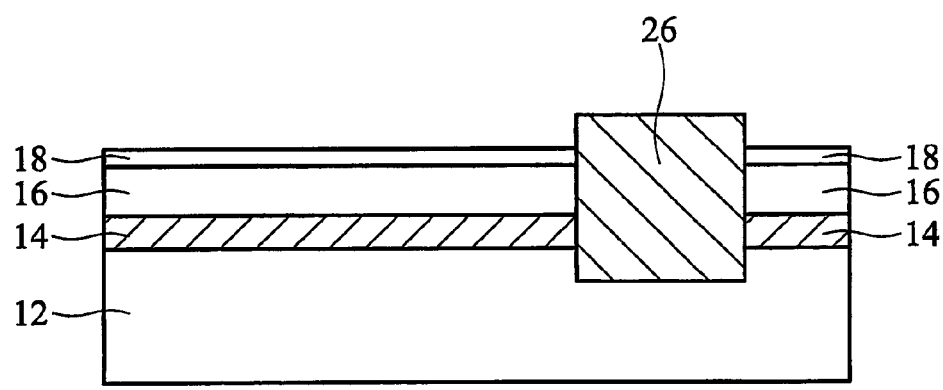

FIG. 4 illustrates the trench 22 filled using high-density plasma. (HDP). Preferably, the filling material is silicon oxide. Other materials such as silicon oxynitride may also be used. A CMP is performed to remove excessive HDP material 24 and a structure, as shown in FIG. 5, is formed. The remaining portion of HDP 24 forms a shallow-trench-isolation (STI) 26. FIG. 6 illustrates a selective etching removing silicon nitride 20 and exposing pad layer 18. The STI 26 may be higher than the pad layer 18 at this time. However, the height of STI 26 will eventually be lowered by subsequent cleaning processes of subsequent steps.

Figure 7:
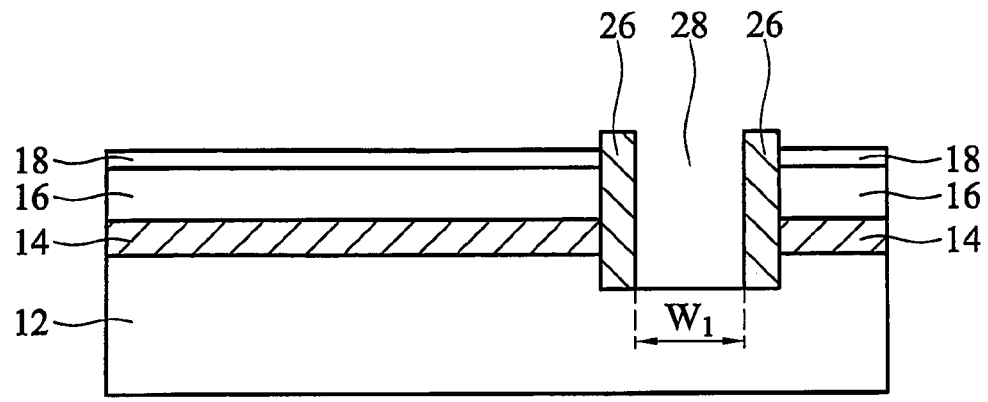
Figure 8:
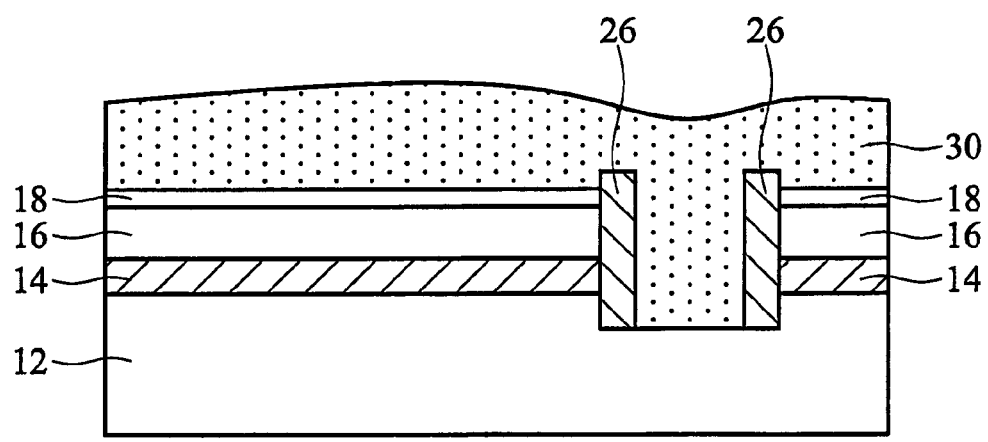
Figure 9:
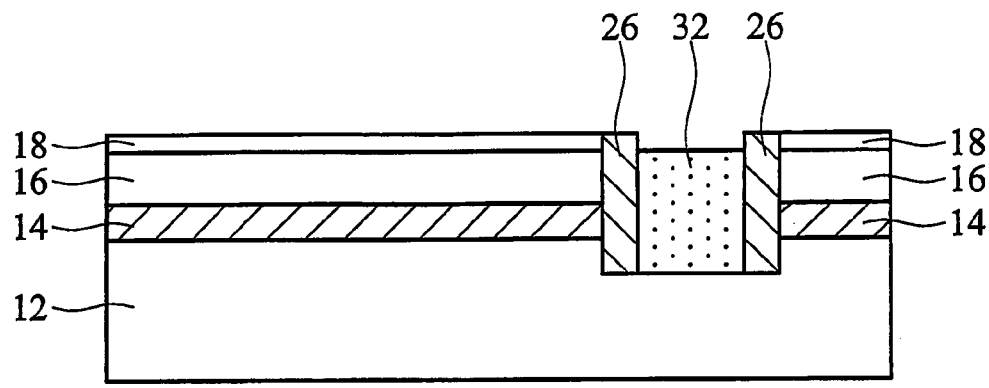

FIG. 7 illustrates a trench 28 formed in STI 26. Trench 28 has a preferred width $W_1$ of about 40 nm to about 200 nm. It is anisotropically etched through STI 26. The etching is preferably selective so that trench 28 reaches and stops at substrate 12. A conductive layer 30 is then formed filling the trench 28 and covering the structure, as shown in FIG. 8. The conductive layer 30 may be a polysilicon layer, a tungsten layer or other known conductive material used for contacting the underlying substrate. It may also be a layer comprising more than two materials or a composite layer. Preferably, a layer of poly silicon 30 is formed filling the trench 28 and covering the structure, as shown in FIG. 8. Poly 30 can be formed by CVD or other known methods. The poly 30 is then etched back and the remaining poly becomes substrate contact 32. The resulting structure is illustrated in FIG. 9. Since the substrate contact 32 electrically connects the bottom gate, it is preferably doped so that the resistivity is lowered. A voltage can be applied to the bottom gate through poly 32. The formation of the substrate contact 32 can also be integrated with the subsequent formation of contact plugs that are typically used to connect metal 1 to devices. In one embodiment of the present invention, the contact openings and the substrate contact 32 are filled with same plug materials, preferably tungsten.

The preferred embodiment of the present invention integrated the process of forming STI 26 and substrate contact 32. Instead of forming STI 26 and substrate contact 32 in separate locations, they are formed together and in the same process.

A SOI structure exists in the region defined by the buried oxide 14 and STI 26. An MOS device having a typical structure can then be formed on the SOI structure. One preferred embodiment of forming the MOS device is presented. However, the formation of the MOS device is well known and a person skilled in the art will recognize alternative embodiments. The pad layer 18 is firstly removed. A gate dielectric 34 is then formed on the substrate 16. Gate dielectric 34 may be formed of thermal oxidation or other methods. A gate electrode 36 is formed on-gate dielectric layer 34. Gate electrode 36 is preferably polysilicon, although it may also be metal or metal compound comprising titanium, tungsten, cobalt, aluminum, nickel or combinations thereof. Gate dielectric 34 and gate electrode 36 are then patterned to form the gate structure. The substrate 16 under gate dielectric 34 eventually becomes a channel region of the resulting transistor. Since the thickness $T_2$ of the substrate 16 is less than about 20 nm, the thickness of the channel is also less than about 20 nm.

Figure 10:
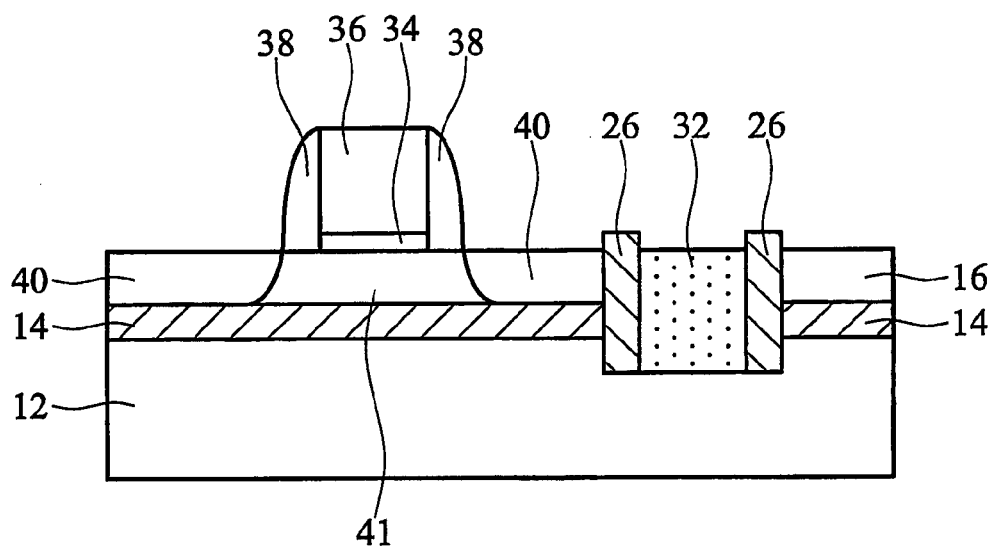

FIG. 10 also illustrates a pair of spacers 38 formed along the sidewalls of the gate dielectric 34 and gate electrode 36. Spacers 38 serve as self-aligning masks for subsequent source/drain formation steps, as described below. The spacers may be formed by well-known methods such as blanket or selectively depositing a dielectric layer over regions including substrate 16 and gate electrode 36, then anisotropically etching to remove the dielectric from the horizontal surfaces and leaving spacers 38. In the preferred embodiment, doping of the regions of substrate 16 on the side of spacers 36 may be performed to form part or the entire transistor source and drain regions 40. In other embodiments, other methods of forming source and drain 40 may be used. However, at least a portion of the source and drain 40 are preferably in the second substrate 16. Remaining substrate 16 between source and drain regions 40 becomes the channel 41 of the double gate device.

Figure 11:
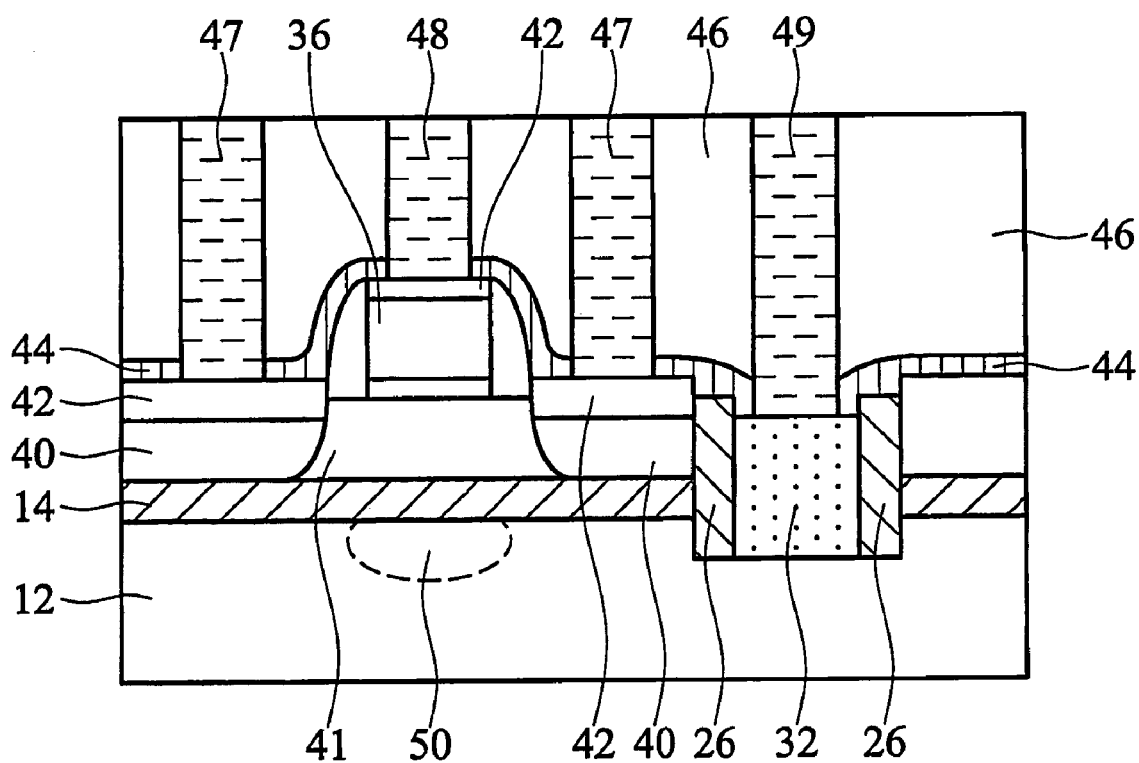

FIG. 11 illustrates the formation of a silicide 42 and an etch stop layer (ESL) 44. Silicide 42 is formed over source and drain regions 40 and preferably over gate electrode 42 as well. In a preferred embodiment, silicide 42 is a metal silicide formed by first depositing a thin layer of metal, such as titanium, cobalt, nickel, tungsten, or the like, over the device, including the exposed surfaces of source and drain 40 and gate electrode 36. The device is then heated, which causes the silicide reaction to occur wherever the metal is in contact with the silicon. After reaction, a layer of metal nitride is formed between silicide and metal. The un-reacted metal is selectively removed through the use of an etchant that does not attack the silicide, $SiO_2$ and silicon substrate.

An etch stop layer (ESL) 44 is next blanket deposited over the device. ESL 44 may be formed using low-pressure chemical vapor deposition (LPCVD), but other CVD methods, such as plasma enhanced chemical vapor deposition (PECVD), and thermal CVD may also be used. ESL 44 is a dielectric and the material may preferably be chosen not only for its dielectric properties, but also for its ability to provide stress to the channel 41. The performance of the resulting double gate device will be improved with a strained channel.

As illustrated in FIG. 11, an inter-level dielectric (ILD), also sometimes known as a pre-metal dielectric (PMD) or an inter-metal dielectric (ED) layer is next deposited over the surface of the structure formed in previous steps. This ILD layer 46 is preferably a low-k material or a silicon dioxide deposited using, e.g., Tetraethyl orthosilicate (TEOS), CVD, PECVD, LPCVD, or other well-known deposition techniques. The ILD layer 46 provides insulation between the transistor and overlying metal lines. A photo-resist material (not shown) may be formed and patterned over the ILD layer 46 in order to form contact openings to the source and drain regions 40, gate electrode 36 and poly 32. The exposed portions of ILD dielectric layer 46 are etched away, thus opening contact openings in the ILD dielectric layer. Note that ESL 44 operates as an etch stop layer during the etching of ILD dielectric layer 46 and thus protects the underlying silicide layer 42. Next, the exposed portions of ESL 44 in the contact openings are etched. Because ESL 44 is quite thin relative to ILD dielectric layer 46, process control and end-point detection are more closely controlled, thus limiting the likelihood of over-etching through the underlying silicide layer 42.

FIG. 11 also illustrates the device after metal plugs 47 and 48 have been formed in the contact openings. Metal plugs 47 and 48, which connects the double gate device to a metal layer, preferably metal layer 1, may be formed of tungsten, aluminum, copper, or other well-known alternatives. Metal plugs 48 may also be composite structures, including, e.g. barrier and adhesion layers, such as titanium/titanium nitride or tantalum nitride, and other layers as well.

A double gate device is thus formed. The semiconductor material in substrate 12 under gate 36, also called top gate 36, forms a bottom gate 50. The double gates are self-aligned since the bottom gate 50 will automatically align to the top gate 36 without any special process steps. The top gate 36 can be controlled through metal plug 48. The bottom gate 50 can be controlled through metal plug 49 and poly 32.

Figure 12:
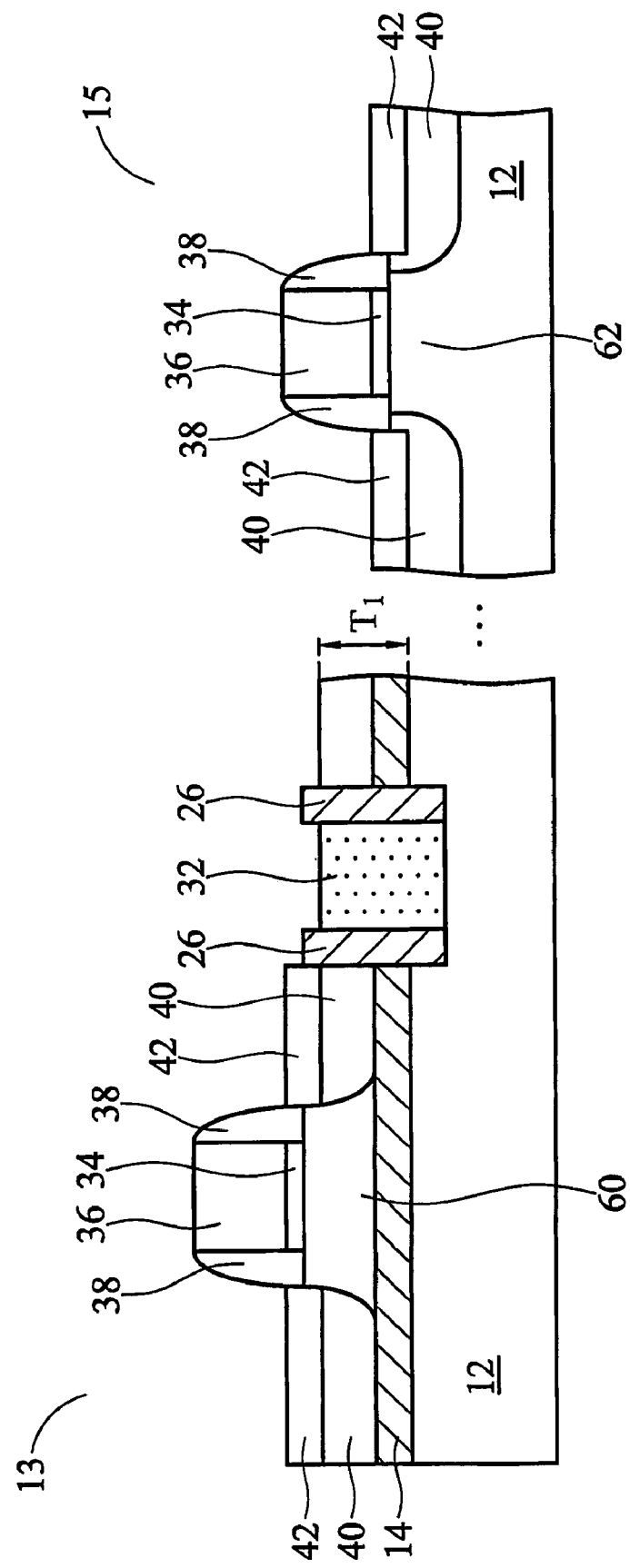
FIG. 12 illustrates a schematic view of a chip with both a double gate region and a bulk region.

The device illustrated in FIG. 11 is preferably formed in double gate region 13. Non-double-gate devices can be formed in bulk region 15. The formation of devices in double gate region 13 and bulk region 15 can be integrated so that the production cost is lowered. FIG. 12 illustrates a chip with both double gate region 13 and bulk region 15. In the preferred embodiment, the MOS transistor 60 on BOX 14 is formed simultaneously with the MOS transistor 62 in bulk region 15, wherein like reference numbers are used indicating simultaneously formed elements.

Figure 13:
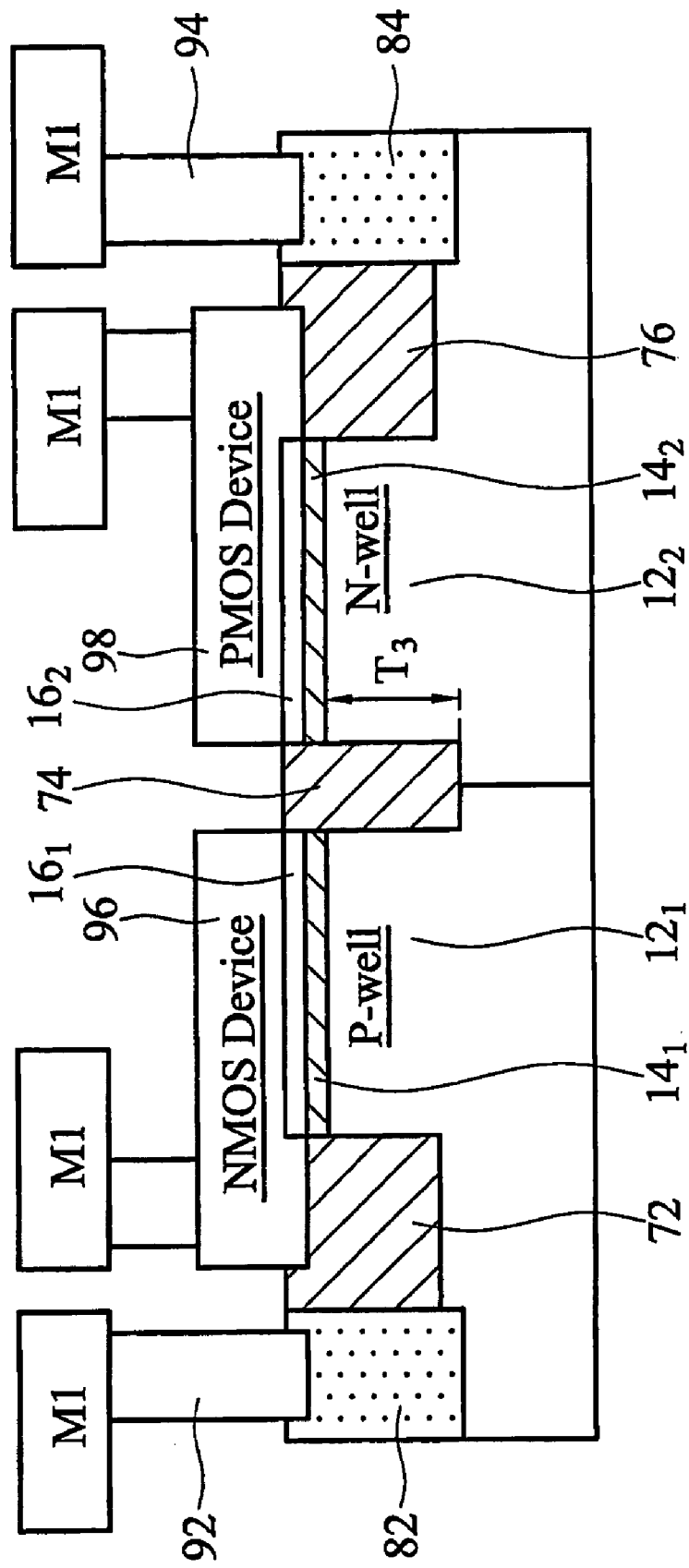
FIG. 13 illustrates the formation of both an NMOS device and a PMOS device.

The device formed on the BOX 14 in previously described steps may be an nMOS device or a pMOS device. FIG. 13 illustrates the formation of both an NMOS device and a pMOS device. It is to be noted that subscripts 1 and 2 are used to distinguish features on the left and right of the FIG. 13, respectively, although one skilled in the art will realize that features having same numbers but different subscripts may actually be one material formed by the same process.

The second substrates $16_1$ and $16_2$ preferably have substantially smaller areas than the first substrates $12_1$ and $12_2$, respectively, and the ratio of the areas is preferably smaller than about 0.5. It is preferred that the nMOS device 96 on the second substrate $16_1$ has an underlying P-well region $12_1$ as the first substrate, and the pMOS device 98 on the second substrate $16_2$ has an underlying N-well region $12_2$. The isolation regions 72, 74, and 76 define boundaries of the second substrates 16$_1$, 16$_2$ and BOXs 14$_1$, 14$_2$. The isolation regions 72, 74 and 76 are trench isolations, preferably shallow trench isolations (STI). A first substrate contact 82 and a second substrate contact 84 are formed in the first isolation region 72 and third isolation region 76, respectively. Substrate contacts 82 and 84 connect to metal layer 1 through contact plugs 92 and 94, respectively. The nMOS device 96 and the pMOS device 98 are isolated by the second trench 74. The isolation regions 72, 74 and 76 may have substantially the same depth or different depths. Preferably, the isolation region 74 extends into the corresponding first substrate for a length T$_3$ of substantially more than about 10 nm so that it effectively isolates the regions one the left and right.

Similar to the structure shown in FIG. 12, the structure shown in FIG. 13 can also be integrated with bulk regions 15. Due to the height difference T$_1$ between the top surfaces of the first substrate 12 and second substrate 16, the top surfaces of the isolation regions 72 and 76 also have a step height over the top surface of the substrate 12 in the bulk region 15.

The preferred embodiment of the present invention has a very thin buried oxide 14 and thin channel 41. By forming very thin buried oxide 14 and thin channel 41, the manufacturing process is also simplified since the lower step height does not need to be leveled. Besides; the device performance is improved. The preferred embodiment of the present invention integrated the process of forming STI and substrate contact by forming the substrate contact through STI. The bottom gate voltage that can be applied is increased to about 1.8V before the device becomes inactive. Therefore the device performance is further improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a first substrate having formed thereon a buried insulating layer;
   a second substrate overlying the buried insulating layer;
   a bulk region on the first substrate wherein the buried insulating layer and the second substrate do not extend over the bulk region;
   a first isolation region extending through the second substrate and the buried insulating layer arid extending partially through the first substrate; and
   a substrate contact in the first isolation region.

2. The semiconductor structure of claim 1 wherein the first isolation region has a portion extending below the buried insulating layer for more than about 10 nm.

3. The semiconductor structure of claim 1 wherein the first isolation region is a shallow trench isolation (STI).

4. The semiconductor structure of claim 1 wherein the top surface of the second substrate has a step height over the top surface of the bulk region.

5. The semiconductor structure of claim 1 further comprising an MOS structure in the bulk region wherein the MOS structure comprises:
   a gate dielectric over the first substrate;
   a gate electrode over the gate dielectric;
   a pair of spacers along opposite sidewalls of the gate electrode and the gate dielectric; and
   source and drain regions along the spacers.

6. The semiconductor of claim 1 wherein the first and second substrates comprise different materials.

7. The semiconductor of claim 1 wherein the first and second substrates comprise same material.

8. The semiconductor structure of claim 1 wherein the first substrate comprises silicon.

9. The semiconductor structure of claim 1 wherein the second substrate comprises silicon geranium.

10. The semiconductor structure of claim 1 wherein the substrate contact electrically connects the first substrate to a metal layer through at least one conductor material.

11. The semiconductor structure of claim 1 wherein the substrate contact comprises at least two filling conductor material.

12. The semiconductor structure of claim 1 wherein the substrate contact comprises conductive material including tungsten.

13. The semiconductor structure of claim 1 wherein the substrate contact comprises conductive material including tungsten and poly silicon.

14. The semiconductor structure of claim 1 further comprising:
   a gate dielectric over the second substrate;
   a gate electrode over the gate dielectric;
   a pair of spacers along opposite sidewalls of the gate electrode and the gate dielectric; and
   source and drain regions in the second substrate along the spacers.

15. The semiconductor structure of claim 1 wherein the second substrate has a thickness of between about 10 nm and about 20 nm.

16. A semiconductor structure comprising:
   a first substrate with a first region having a buried insulating layer with a thickness of less than 30 nm;
   a second substrate overlying the buried insulating layer;
   a second region substantially free of the buried insulator layer and the second substrate;
   a first isolation region extending through the second substrate and the buried insulating layer and extending into the first substrate; and
   a substrate contact in the first isolation region.

17. The semiconductor structure of claim 16 further comprising a second isolation region through the buried insulating layer with an extending portion in the first substrate.

18. The semiconductor structure of claim 17 wherein the second isolation region is between an N-well region and a P-well region in the first substrate.

19. The semiconductor structure of claim 18 wherein the P-well region is below the nMOS device and the N-well region is below the nMOS device.

20. The semiconductor structure of claim 17 wherein the second isolation region is between an nMOS device and a pMOS device on a second substrate.

21. The semiconductor structure of claim 16 wherein the extending portion has a length of substantially more than about 10 nm.

22. The semiconductor structure of claim 16 further comprising a third isolation region having a different depth as the first isolation region.

23. The semiconductor structure of claim 22 further comprising a bulk region on the first substrate wherein the buried insulating layer and the second substrate do not extend over the bulk region, and wherein the top surfaces of the first and third isolation regions have a step height over the top surface of the bulk region.

24. The semiconductor structure of claim 16 wherein the ratio of the areas of the first region and the second region is substantially less than about 0.5.

25. A semiconductor structure comprising:
a first substrate;
a buried insulating layer over the first substrate wherein the buried insulating layer has a thickness of less than about 30 nm;
a second substrate over the buried insulating layer;
a gate dielectric over the second substrate;
a gate electrode over the gate dielectric;
a spacer along a sidewalls of the gate electrode and the gate dielectric;
a source/drain region in the substrate on a side of the spacer;
a first isolation region extending through the second substrate and the buried insulating layer and into the first substrate, wherein regions over top surfaces of the second substrate are free from the first isolation region; and
a substrate contact in the first isolation region, the substrate contact extending to the first substrate.

26. The semiconductor structure of claim 25 wherein the second substrate has a thickness of less than about 20 nm.

27. The semiconductor structure of claim 26 wherein the second substrate has a thickness of between about 10 nm and about 20 nm.

28. The semiconductor structure of claim 25 wherein the first isolation region extends below the buried insulating layer for more than about 10 nm.

* * * * *

UNITED STATES PATENT AND TRADEMARK OFFICE
CERTIFICATE OF CORRECTION

PATENT NO. : 7,230,270 B2  Page 1 of 1
APPLICATION NO. : 10/997446
DATED : June 12, 2007
INVENTOR(S) : Chen et al.

It is certified that error appears in the above-identified patent and that said Letters Patent is hereby corrected as shown below:

Column 6, line 6; delete "(ED)" insert --(IMD)--
Column 6, line 53; delete "NMOS" insert --nMOS--
Column 7, line 26; delete "Besides;" insert --Besides,--
Column 7, line 62; delete "arid" insert --and--

Signed and Sealed this

Seventh Day of August, 2007

JON W. DUDAS
*Director of the United States Patent and Trademark Office*